United States Patent [19]
Hwang

[11] Patent Number: 5,592,128
[45] Date of Patent: Jan. 7, 1997

[54] OSCILLATOR FOR GENERATING A VARYING AMPLITUDE FEED FORWARD PFC MODULATION RAMP

[75] Inventor: Jeffrey H. Hwang, Saratoga, Calif.

[73] Assignee: Micro Linear Corporation, San Jose, Calif.

[21] Appl. No.: 413,232

[22] Filed: Mar. 30, 1995

[51] Int. Cl.[6] ............................ G05F 1/613; H02M 3/335; H03K 4/50
[52] U.S. Cl. ...................... 331/61; 323/288; 327/132; 327/135; 327/163; 331/75; 331/143; 363/21
[58] Field of Search ............................ 331/75, 111, 143, 331/61, 47, 55; 327/131, 132, 135, 141, 162, 163; 363/16, 20, 21, 24, 25, 26; 323/288

[56] References Cited

U.S. PATENT DOCUMENTS

| | | | |
|---|---|---|---|
| 3,603,809 | 9/1971 | Uchiyama | 327/131 |
| 3,883,756 | 5/1975 | Dragon | 327/131 |
| 4,407,588 | 10/1983 | Arichi et al. | 331/111 |
| 4,651,231 | 3/1987 | Douglas, Jr. | 358/342 |
| 4,731,574 | 3/1988 | Melbert | 323/275 |
| 4,736,151 | 4/1988 | Dishner | 323/224 |
| 5,034,873 | 7/1991 | Feldtkeller | 363/21 |
| 5,278,490 | 1/1994 | Smedley | 323/284 |
| 5,412,308 | 5/1995 | Brown | 323/267 |
| 5,457,622 | 10/1995 | Arakawa | 363/59 |
| 5,461,302 | 10/1995 | Garcia et al. | 323/222 |

*Primary Examiner*—Siegfried H. Grimm
*Attorney, Agent, or Firm*—Haverstock & Associates

[57] ABSTRACT

An oscillator for generating a varying amplitude feed forward power factor correction (PFC) modulation ramp signal includes a clock generating circuit and a ramp generating circuit. The PFC ramp signal generated by the ramp generating circuit is used within a power factor correction circuit of a switching mode power converter. The timing capacitor used within the ramp generating circuit is charged from the full wave rectified line input voltage so that the amplitude of the generated ramp output signal will follow the full wave rectified input signal, thereby maintaining the current loop bandwidth at a constant value and improving the transient response of the circuit. A one-shot circuit is coupled between the discharge transistor of the clock generating circuit and the discharge transistor of the ramp generating circuit for synchronizing the clock and ramp reference signals generated by the oscillator so that the frequency of the ramp reference signal is equal to the frequency of the clock signal. The one-shot circuit has a duty cycle which is always a fixed percentage of the period of the clock reference signal.

30 Claims, 12 Drawing Sheets

OSCILLATOR FOR GENERATING A VARYING AMPLITUDE FEED FORWARD PFC MODULATION RAMP

FIELD OF THE INVENTION

This invention relates to the field of oscillators. More particularly, the present invention relates to the field of ramp generating oscillators for use as a reference within a power factor correction (PFC) circuit of a switching mode power converter.

BACKGROUND OF THE INVENTION

For switching mode power converters the output voltage is controlled by an electronic circuit which measures a level of electric current within the circuit, compares that measured level to a predetermined desired level, and develops a response to that measurement elsewhere in the circuit in order to more accurately achieve the desired level. A switching mode power converter which uses a trailing edge modulation control scheme is illustrated in FIG. 1. The input voltage VIN is coupled to a first terminal of the inductor L1. A second terminal of the inductor L1 is coupled to a first terminal of the switch SW1 and to the anode of the diode SW2. A capacitor C1 is coupled between the cathode of the diode SW2 and a second terminal of the switch SW1. A load RL is coupled across the capacitor C1. A potentiometer PT1 is coupled across the load RL and provides a negative input to a voltage error amplifier 10. A reference voltage REF is coupled to the positive input of the error amplifier 10. The output VEAO of the voltage error amplifier 10 is coupled as the positive input of a modulating comparator 14. The negative input of the modulating comparator 14 is coupled to receive the ramp output of an oscillator 12. The output of the modulating comparator 14 is coupled as the reset input R of a flip flop 16. The input D of the flip flop 16 is coupled to the inverted output $\overline{Q}$ of the flip flop 16. A clock input CLK of the flip flop 16 is coupled to the clock output of the oscillator 12. The output Q of the flip flop 16 is coupled to control the operation of the switch SW1.

The output voltage VOUT is established by integrating the inductor current I1 in the LC filter network. This integrated current is supplied to the load circuit as the converted output voltage VOUT. In order to establish the proper output voltage from a given input voltage, the input voltage VIN is switched in and out of the circuit by the switch SW1. The resulting oscillating signal is integrated in the LC network to form the desired output voltage VOUT. If the input voltage VIN changes or varies over time, the frequency at which the switch SW1 is opened and closed can also be varied in order to maintain the desired output voltage VOUT.

Pulse width modulation (PWM) is a technique used to maintain a constant output voltage VOUT when the input voltage does not remain constant and varies over time. By changing the frequency at which the switch SW1 is opened and closed, as the input voltage changes, the output voltage VOUT can be maintained at a constant level as desired. The inductor current I1 is stored as a voltage level on the plates of the capacitor C1 when the switch SW1 is open. Because of its parallel connection to the output of the circuit, the voltage across the capacitor C1 is equivalent to the output voltage VOUT and the voltage across the potentiometer PT1. A predetermined fraction of that voltage is measured from the potentiometer PT1 forming the voltage VEA which is input into the negative terminal of the voltage error amplifier 10 and is compared to the reference voltage REF. This comparison determines how close the actual output voltage VOUT is to the desired output voltage.

Conventional pulse width modulation techniques use the trailing edge of the clock signal, so that the switch will turn on right after the trailing edge of the system clock. FIG. 1 illustrates such a trailing edge modulation control scheme. The leading edge of the clock signal may also be used for pulse width modulation. In order to implement a leading edge modulation control scheme the inputs to the error amplifier 10 must be reversed: the voltage VEA from the potentiometer PT1 is coupled to the positive terminal of the voltage error amplifier 10 and the reference voltage REF is coupled to the negative terminal of the voltage error amplifier 10.

FIGS. 2, 3 and 4 show corresponding voltage waveforms with respect to time of different voltage levels at different points within the switch control circuitry 31 of the trailing edge scheme. The time axis for the FIGS. 2, 3 and 4 has been drawn to correspond in all three figures. FIG. 2 illustrates the voltage levels with respect to time of the error amplifier output VEAO and the modulating ramp output of the oscillator 12. FIG. 3 illustrates the voltage level of the control voltage VSW1 for the switch SW1 with respect to time. The switch SW1 is "on" or closed when the control voltage VSW1 is at a high voltage level. The switch SW1 is "off" or open when the control voltage is at a low voltage level. FIG. 4 illustrates the clock impulses with respect to time of the clock output of the oscillator 12.

The switch SW1 will turn on after the trailing edge of the system clock. Once the switch SW1 is on, the modulating comparator 14 then compares the error amplifier output voltage VEAO and the modulating ramp. When the modulating ramp reaches the error amplifier output voltage, the output of the modulating comparator 14 will fall to a logical low voltage level. Because of the inverter coupled to the input, the input R of the flip flop 16 will then rise to a logical high voltage level thereby resetting the output Q of the flip flop 16 to a logical low voltage level and turning the switch SW1 off. When the switch SW1 is on, the inductor current IL will ramp up. The effective duty cycle of the trailing edge modulation is determined during the on time of the switch. FIG. 1 illustrates a typical trailing edge control scheme using a single boost power converter stage. As the input voltage VIN varies over time, the duty cycle or time that the switch SW1 is on will vary in order to maintain a constant output voltage VOUT.

A more detailed circuit diagram of a power factor controller circuit is illustrated in FIG. 5. Elements that are identical to those of FIG. 1 use the same reference numerals. The line voltage is coupled to the input terminals 20 and 22. The input terminals 20 and 22 are coupled across a full wave bridge rectifier 28. The full wave bridge rectifier 28 is also coupled to provide the DC input signal to the inductor L1. The output of the voltage error amplifier 10 is coupled as an input to a multiplier 30. A first terminal of a reference resistor R1 is coupled to the first terminal of the inductor L1. A second terminal of the resistor R1 is coupled as an input to the multiplier 30. The output of the multiplier 30 is coupled to a positive input terminal of a current error amplifier 32 and to a first terminal of a resistor RC. A second terminal of the resistor RC is coupled to the full wave bridge rectifier 28 and to a first terminal of a sense resistor RS. A second terminal of the sense resistor RS is coupled to the output terminal 26, to a first terminal of a resistor RCI and to ground. A second terminal of the resistor RCI is coupled to a negative input terminal of the current error amplifier 32.

The output of the current error amplifier 32 is coupled to the negative input terminal of the modulating comparator 14 and as a feedback to the negative input terminal of the current error amplifier 32. The ramp output of the oscillator 12 is coupled to the positive input terminal of the modulating comparator 14. The output of the modulating comparator 14 is coupled as an input R of a flip flop 16. The clock output of the oscillator 12 is coupled as an input S of the flip flop 16. The output Q of the flip flop 16 is coupled to the gate of the switch SW1. In the circuit illustrated in FIG. 5 a MOSFET is used as the switch SW1.

The function of the power factor correction section is to ensure that the current follows the voltage in time and amplitude proportionally. A reference current that is proportional to the input full wave rectified voltage is produced with the help of the reference resistor R1. The reference current is applied to one of the inputs of the multiplier 30. The other input of the multiplier 30 is the output of the voltage error amplifier 10. The multiplier 30 is usually of a current input type which enables the multiplier 30 to have greater ground noise immunity. When there is a current at its input, the terminal voltage of the multiplier 30 is a diode drop between 0.7 V and 1 V.

The output of the multiplier 30 is a current which is the product of the reference current, the output of the voltage error amplifier 10 and a gain adjustor factor which will be described below. This output current is applied to the resistor RC. The voltage across the resistor RC subtracts from the sensed voltage across the sense resistor RS and is applied to the current error amplifier 32. Under closed loop control the current error amplifier 32 will try to keep this voltage differential near the zero volt level. This forces the voltage produced by the return current flowing through the sense resistor RS to be equal to the voltage across the resistor RC.

The amplified current error signal output from the current error amplifier 32 is then applied to the inverting input of the modulating comparator 14. The other input of the modulating comparator 14 is coupled to receive the ramp signal output from the oscillator 12. Pulse width modulation is obtained when the amplified error signal that sets up the trip point modulates up and down.

A current control loop modulates the duty cycle of the switch SW1 in order to force the input current waveshape to follow the shape of the input voltage. The input voltage is a full wave rectified sinewave. The current control loop and the power delivery circuitry must have at least enough bandwidth to follow this full wave rectified waveform.

As the RMS input voltage increases, the gain of the system will increase by the voltage RMS value $V_{RMS}$. The gain of the system will increase as the input voltage increases because the input to the multiplier 30 is driven by the input voltage through the reference resistor R1. The gain of the multiplier 30 can be adjusted as a function of the RMS input voltage in order to cancel the square law dependency of the signal. A graph of a typical gain adjustor gain for the multiplier 30 is illustrated in FIG. 6. The gain K of the multiplier 30 is curve fitted to a value equal to $1/(V_{RMS})^2$ for universal input. For an a.c. input voltage less than 85 VAC the gain K starts brown out and will not fit the $1/(V_{RMS})^2$ curve. Since the output of the multiplier 30 is dependent on the rectified sinusoidal input voltage, the output of the multiplier 30 is generated in phase with the sinusoidal line input voltage.

A schematic diagram of a basic dual comparator R-C relaxation oscillator 12 which is typically used to generate the clock and ramp reference signals used within the power factor correction circuit is illustrated in FIG. 7. This circuit consists of three functional subblocks: (i) the comparators $X_1$ and $X_2$ for detecting the threshold voltages $V_{TH}$ and $V_{TL}$, set by the resistive divider network including the resistors $R_A$, $R_B$ and $R_C$; (ii) the timing components including the resistor $R_T$, the capacitor $C_T$ and the resistor $R_D$; and (iii) an R-S latch $X_3$ for controlling the discharge of the capacitor C, through the npn transistor $Q_D$ and the resistor $R_D$.

Assuming that the output Q of the R-S latch $X_3$ is at a logical low and the transistor $Q_D$ is turned off initially, the resistor $R_T$ will charge the capacitor $C_T$ towards the upper threshold voltage $V_{TH}$. The upper threshold voltage $V_{TH}$ is set by the resistive divider as $$V_{TH} = \frac{V_{CC}(R_B + R_C)}{R_A + R_B + R_C} \quad (1)$$

The output of the comparator $X_1$ rises from a logical low voltage level to a logical high voltage level when the voltage across the capacitor $C_T$ crosses the upper threshold voltage $V_{TH}$ and the positive input of the comparator $X_1$ becomes greater than its negative input. Once the output of the comparator $X_1$ switches to a logical high voltage level, the input S of the R-S latch $X_3$ will also be raised to a logical high voltage level and the output Q of the R-S latch $X_3$ will rise from a logical low voltage level to a logical high voltage level. The transistor $Q_D$ will then turn on and saturate. If the value of the resistor $R_D$ is properly chosen, the transistor $Q_D$ and the resistor $R_D$ will discharge the voltage across the capacitor $C_T$ towards the lower threshold voltage $V_{TL}$ set again by the resistive divider network as $$V_{TL} = \frac{V_{CC}(R_C)}{R_A + R_B + R_C} \quad (2)$$

As the voltage across the capacitor $C_T$ is discharged below the upper threshold voltage $V_{TH}$ and the positive input of the comparator $X_1$ becomes less than the negative input, the output of the comparator $X_1$ will drop from a logical high voltage level to a logical low voltage level. When the voltage across the timing capacitor $C_T$ falls below the lower threshold voltage $V_{TL}$ so that the negative input of the comparator $X_2$ is less than the positive input, the output of the comparator $X_2$ will rise to a logical high voltage level and the R-S latch $X_3$ will reset. When the R-S latch $X_3$ is reset the output Q of the R-S latch will drop to a logical low voltage level turning the transistor $Q_T$ off and ending the discharge cycle. The resistor $R_T$ will then charge the timing capacitor $C_T$ and the cycle will repeat. The timing diagram of the oscillator of FIG. 7 is shown in FIG. 8. The ramp output is taken from the node formed between the timing resistor $R_T$ and the timing capacitor $C_T$. The clock output is taken from the output Q of the R-S latch $X_3$. In the oscillation circuits of the prior art the amplitude of the ramp output is fixed between the threshold values $V_{TH}$ and $V_{TL}$. Within a power factor correction circuit, a fixed amplitude ramp signal causes the bandwidth of the current control loop to vary and also has a detrimental effect on the transient response of the circuit.

What is needed is a ramp reference signal with an amplitude which varies as the a.c. input signal varies, for use by the power factor correction controller. What is further needed is a synchronizing circuit which will synchronize the ramp reference signal to the clock reference signal.

SUMMARY OF THE INVENTION

An oscillator for generating a varying amplitude feed forward PFC modulation ramp signal includes a clock generating circuit and a ramp generating circuit. The PFC ramp signal generated by the ramp generating circuit is used within a power factor correction circuit of a switching mode power converter. The timing capacitor used within the ramp generating circuit is charged from the full wave rectified line input voltage so that the amplitude of the generated ramp output signal will follow the full wave rectified input signal, thereby maintaining the current loop bandwidth at a constant value and improving the transient response of the circuit. A one-shot circuit is coupled between the discharge transistor of the clock generating circuit and the discharge transistor of the ramp generating circuit for synchronizing the clock and ramp reference signals generated by the oscillator so that the frequency of the ramp reference signal is equal to the frequency of the clock signal. The one-shot circuit has a duty cycle which is always a fixed percentage of the period of the clock reference signal.

DETAILED DESCRIPTION OF THE PREFERRED EMBODIMENT

The present invention includes an oscillator which generates a varying amplitude ramp signal for use within a power factor correction circuit for a switching mode power supply. The timing capacitor used within the ramp generating circuit is charged from the full wave rectified line input voltage. A one-shot circuit is coupled between the discharge transistor of the clock generating circuit and the discharge transistor of the ramp generating circuit for synchronizing the clock and ramp reference signals generated by the oscillator so that the frequency of the ramp reference signal is equal to the frequency of the clock reference signal. The one-shot circuit is designed so that the duty cycle of its output is five percent of the period of the clock signal.

Figure 7:
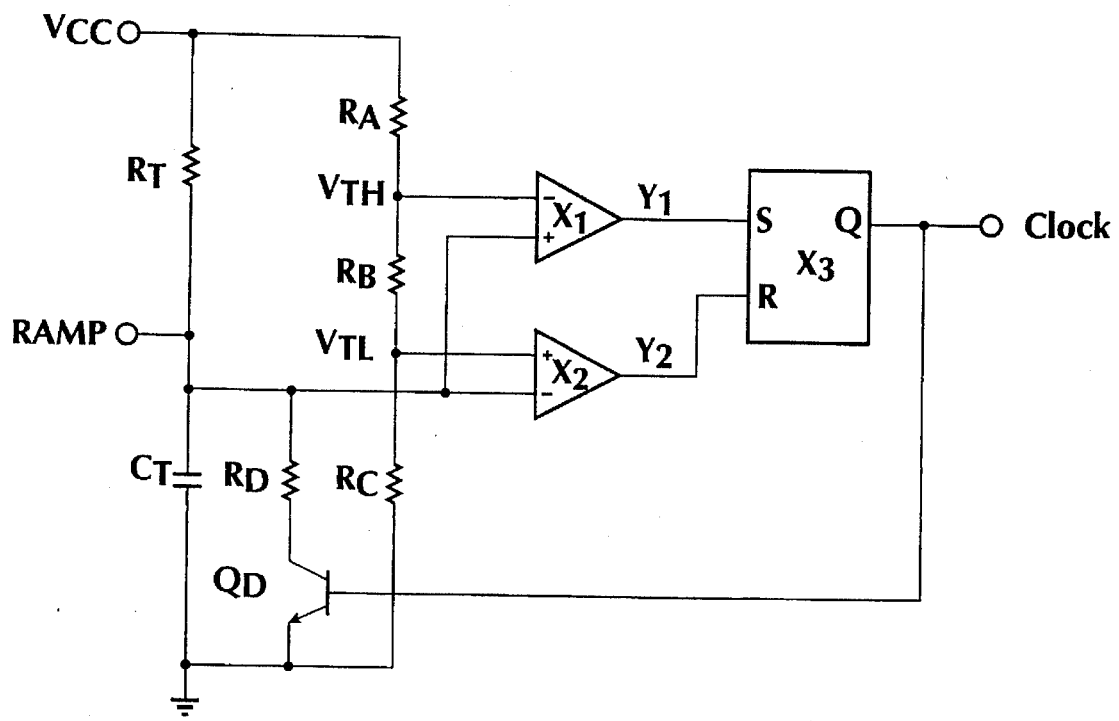
FIG. 7 illustrates a schematic diagram of a basic dual comparator R-C relaxation oscillator of the prior art.
Figure 8:
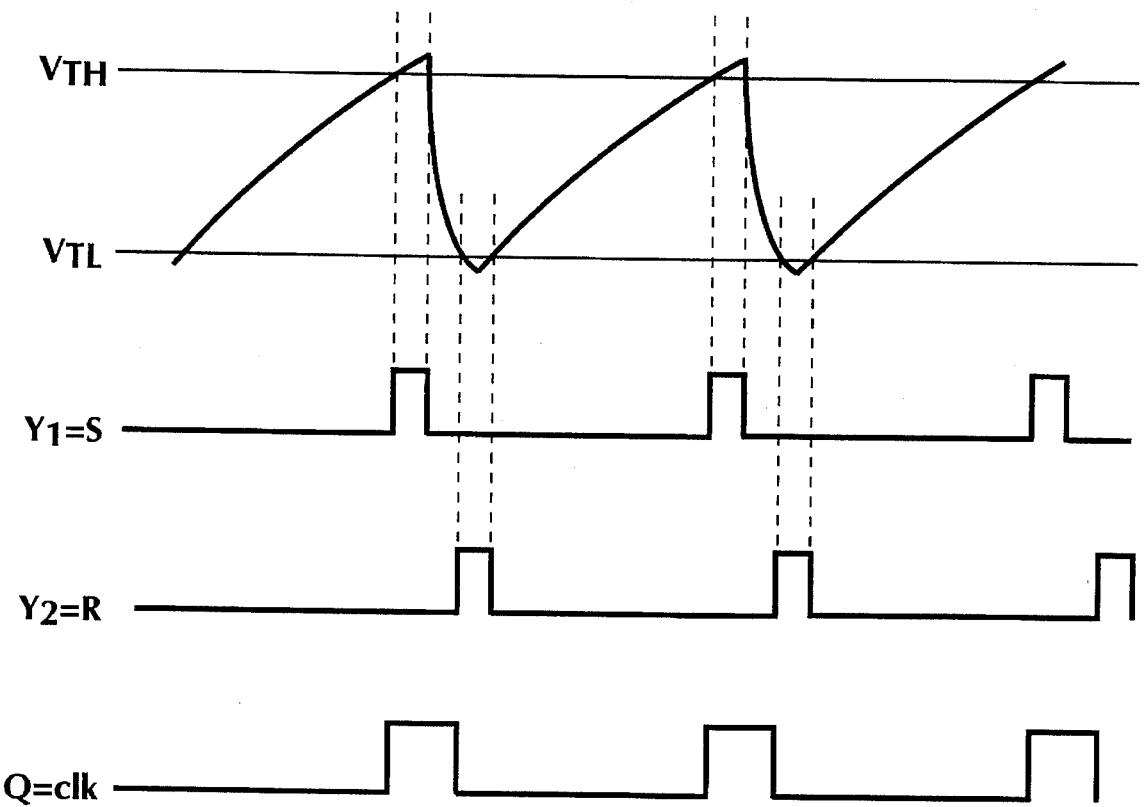
FIG. 8 illustrates a timing diagram of the oscillator of FIG. 7.
Figure 9:
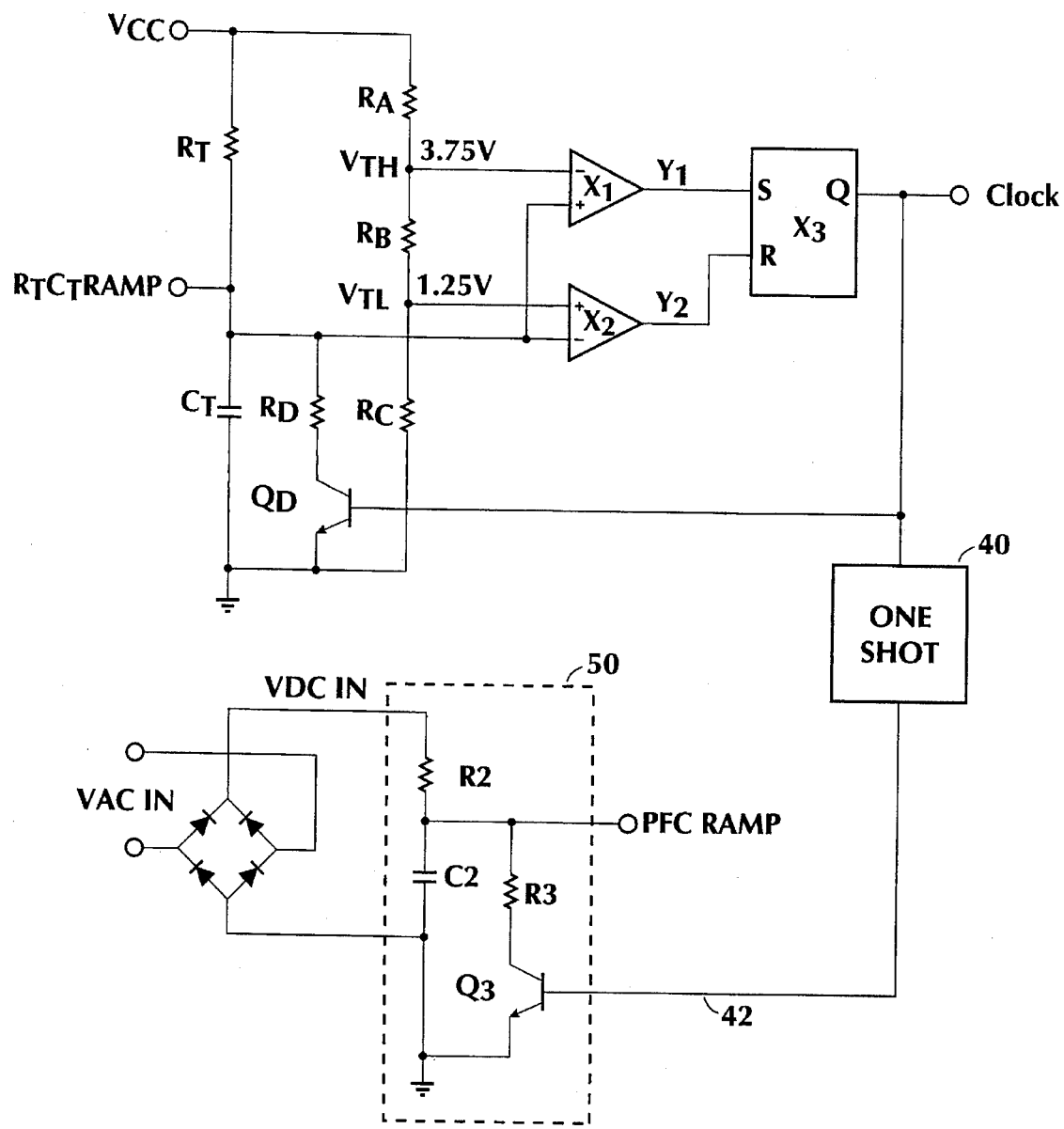
FIG. 9 illustrates a schematic diagram of an embodiment of the oscillator of the present invention.

An oscillator of the present invention is illustrated in FIG. 9. The oscillator includes the clock generating circuit, as illustrated in FIG. 7, a ramp generating circuit 50 and a one-shot synchronizing circuit 40. The ramp generating circuit 50 includes a timing resistor R2, a timing capacitor C2, a discharge resistor R3 and a discharge transistor Q3. A first terminal of the resistor R2 is coupled to receive a full wave rectified input signal VDCIN. A second terminal of the resistor R2 is coupled to a first terminal of the capacitor C2 and to a first terminal of the discharge resistor R3. A second terminal of the capacitor C2 is coupled to ground. A second terminal of the resistor R3 is coupled to a collector of the npn transistor Q3. An emitter of the transistor Q3 is coupled to ground. The clock reference signal is coupled to an input of the one-shot circuit 40. An output of the one-shot circuit 40 is coupled to a base of the transistor Q3 for initiating the discharge of the capacitor C2. The PFC ramp reference signal is taken from the node formed by the second terminal of the resistor R2, the first terminal of the capacitor C2 and the first terminal of the resistor R3.

Figure 13:
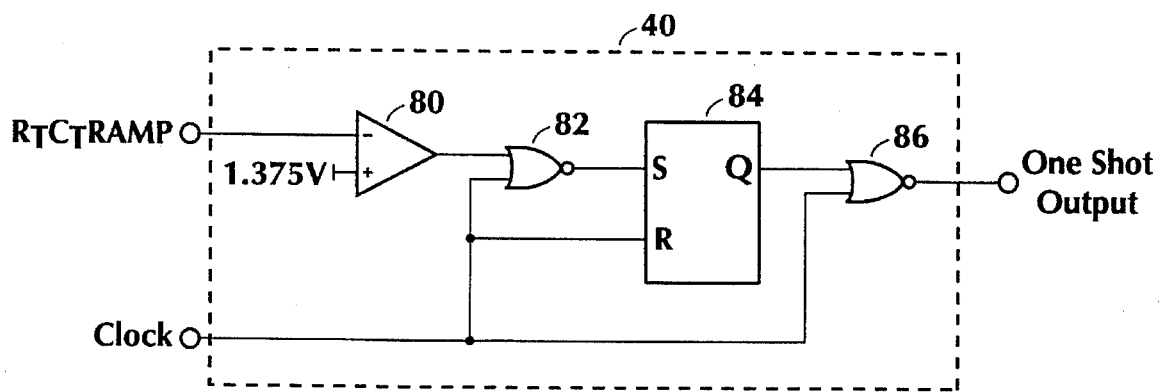
FIG. 13 illustrates a schematic diagram of the one-shot circuit used to syncronize the PFC Ramp output to the clock output signal of the oscillator of the present invention.

The one-shot synchronizing circuit 40 is designed to have a duty cycle which is always a predetermined percentage of the period of the clock signal output from the flip flop X3. In the preferred embodiment the predetermined percentage is equal to five percent. Therefore, as the frequency of the input signal varies, the one-shot synchronizing circuit 40 will always have a duty cycle which tracks the period of the clock signal. The circuit diagram of the one-shot circuit 40 of the present invention is illustrated in FIG. 13 and will be discussed in detail below.

Figure 1:
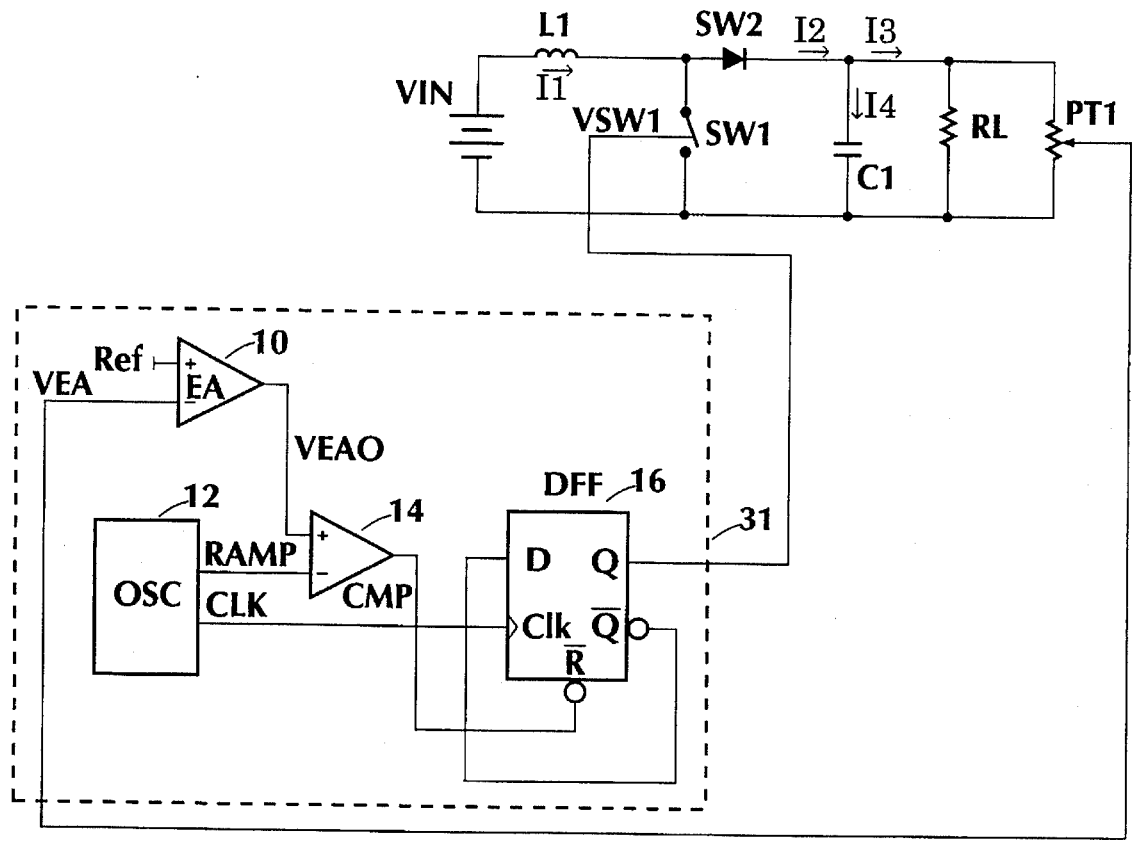
FIG. 1 illustrates a schematic diagram of a switching mode power converter of the prior art which uses a trailing edge modulation control scheme.
Figure 2:
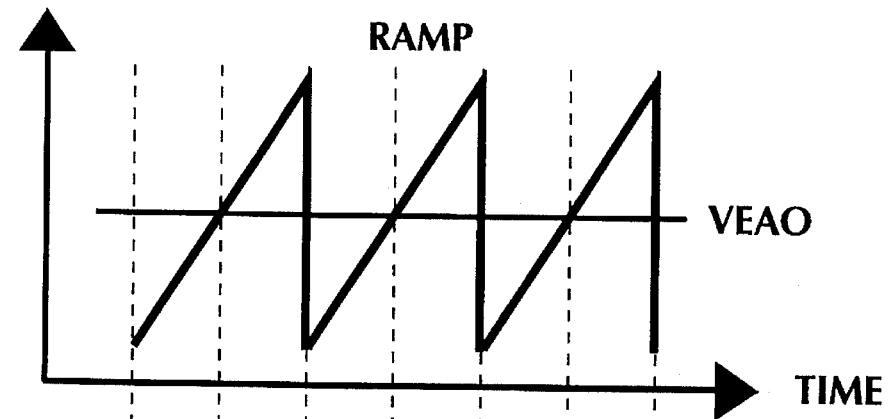
FIG. 2 illustrates the voltage levels with respect to time of the error amplifier output and the ramp output of the oscillator for the trailing edge modulation circuit of FIG. 1.
Figure 3:
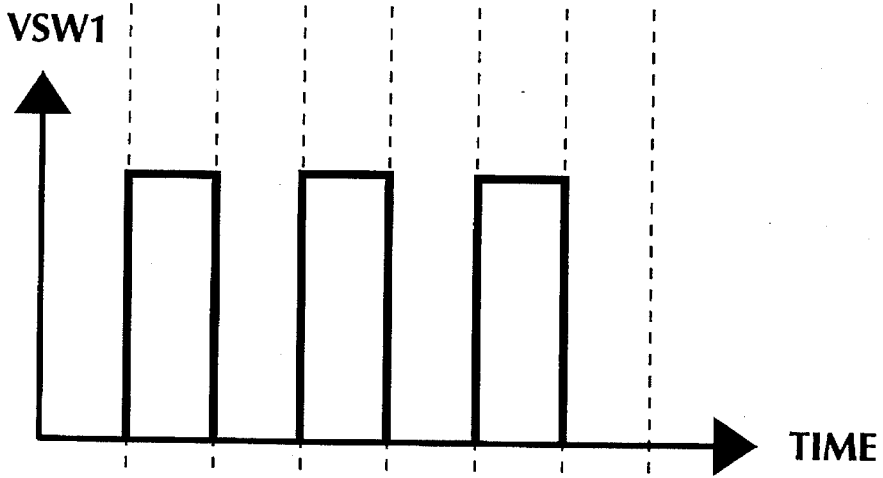
FIG. 3 illustrates the voltage level of the switch SW1 with respect to time.
Figure 4:
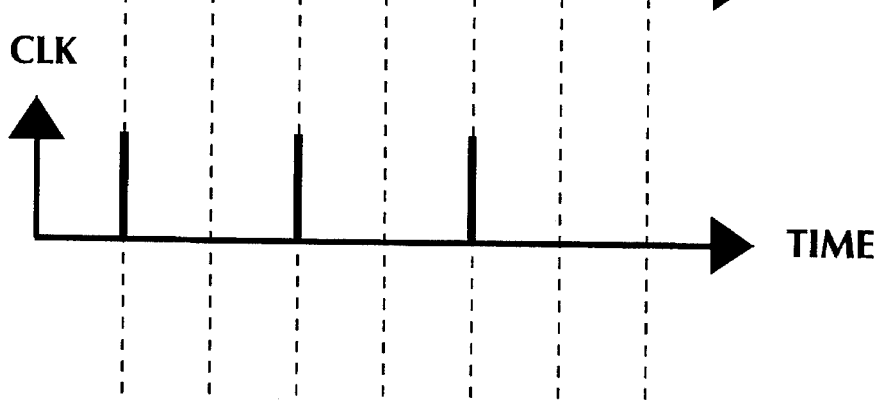
FIG. 4 illustrates the clock impulses with respect to time of the clock output of the oscillator.
Figure 5:
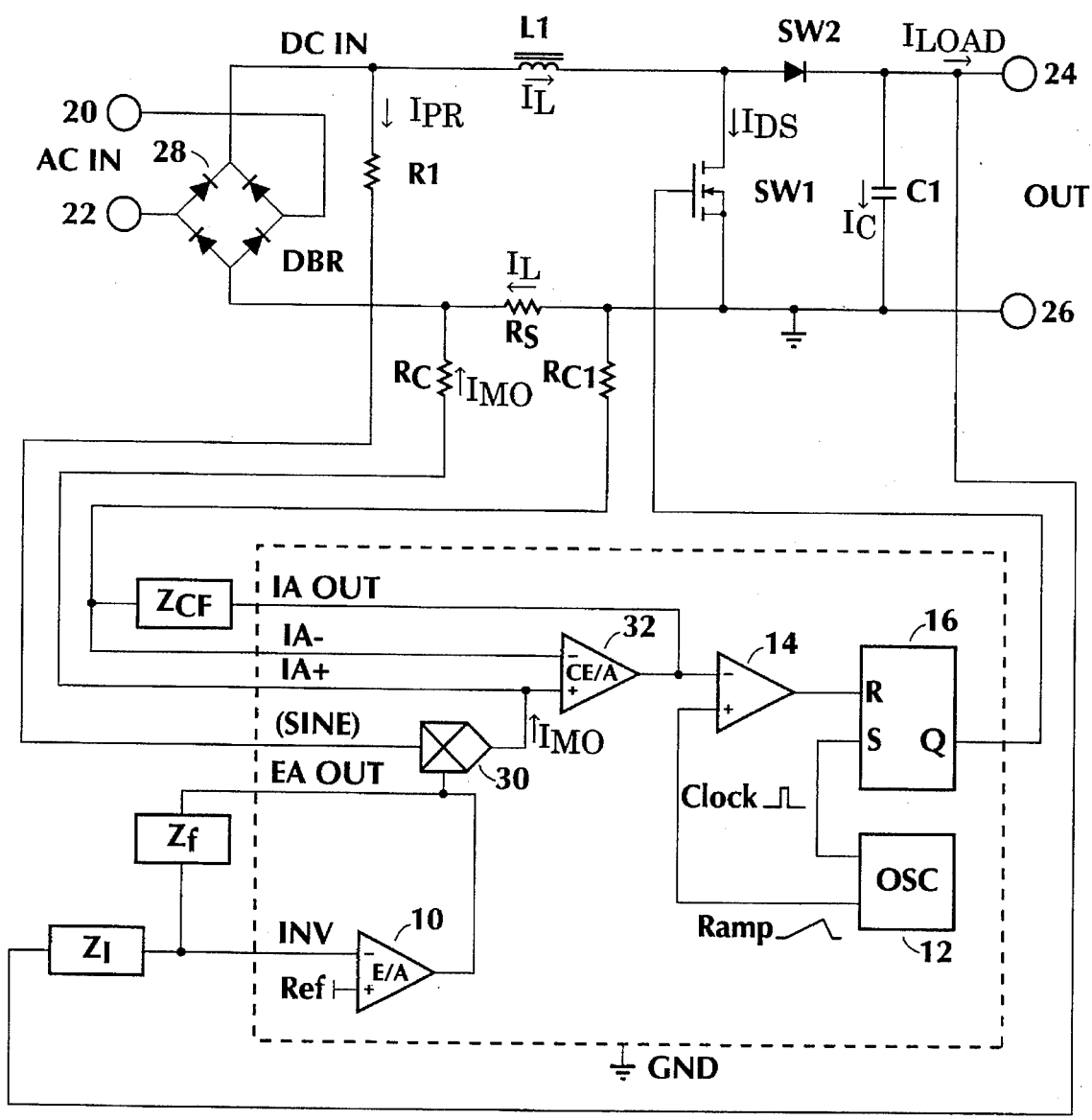
FIG. 5 illustrates a schematic diagram of a power factor controller circuit of the prior art.
Figure 6:
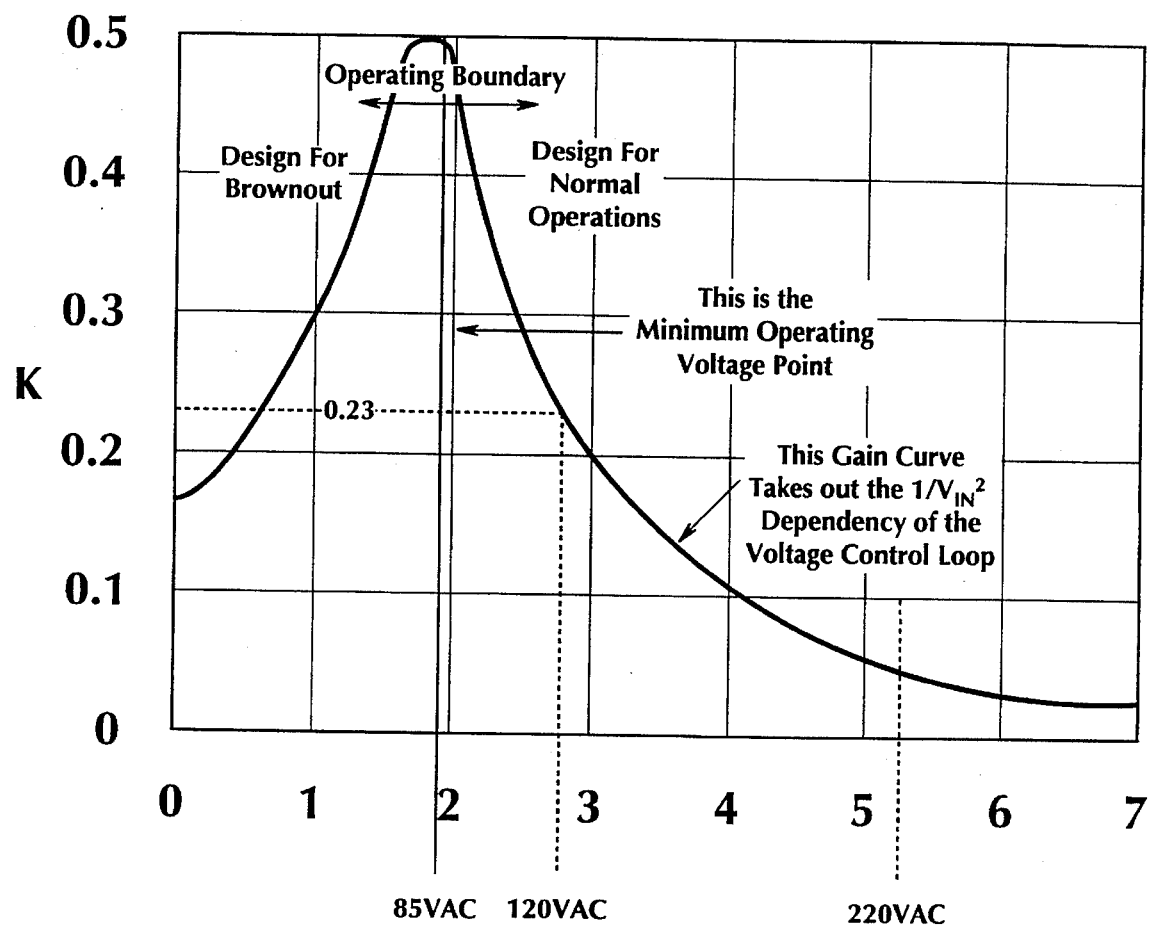
FIG. 6 illustrates a graph of a gain adjustor gain for a multiplier of the prior art.
Figure 10:
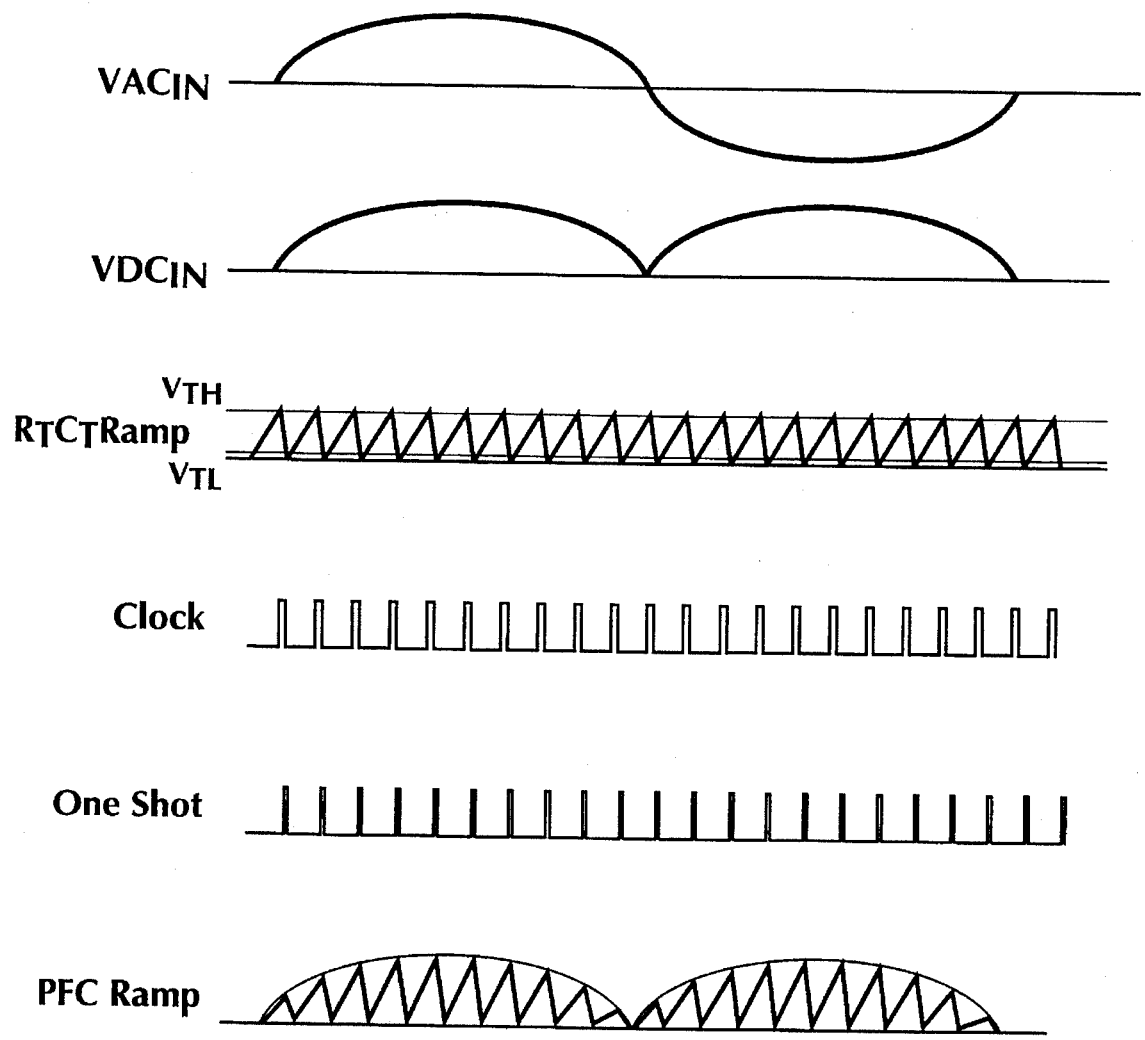
FIG. 10 illustrates a timing diagram of the oscillator of FIG. 9.

Timing diagrams illustrating waveforms from relevant points within the oscillator circuit of FIG. 9 are illustrated in FIG. 10, including the input voltage VACIN, the corresponding full wave rectified input signal VDCIN, the $R_T C_T$ ramp waveform, the corresponding clock signal, the output of the one-shot circuit 40 and the corresponding PFC Ramp waveform. The one-shot circuit 40 is designed to have an output pulse which begins at the trailing edge of the clock signal and has a duration equal to five percent of the period of the clock signal. The output pulse from the one-shot circuit 40 controls the discharge of the timing capacitor C2 in order to synchronize the clock reference signal and the PFC Ramp signal and ensure that the frequency of the PFC ramp signal is equal to the frequency of the clock reference signal. Because the voltage source for the charging capacitor C2 is the full wave rectified line input voltage, the amplitude of the PFC Ramp signal will vary as the amplitude of the full wave rectified signal VDCIN varies in a sinusoidal fashion. This PFC Ramp signal is then utilized within a power factor correction circuit, as illustrated in FIG. 1 or FIG. 5, and provided as an input to the modulating comparator of the power factor correction circuit. It should be noted that while the amplitude of the PFC Ramp signal generated by the oscillator of the present invention is varying, the frequency of the PFC Ramp signal is equal to the frequency of the $R_T C_T$ ramp signal. By allowing the amplitude of the PFC Ramp signal to vary with the full wave rectified input voltage, the bandwidth of the current control loop of the power factor correction circuit is kept constant and the transient response of the circuit is improved.

Figure 11:
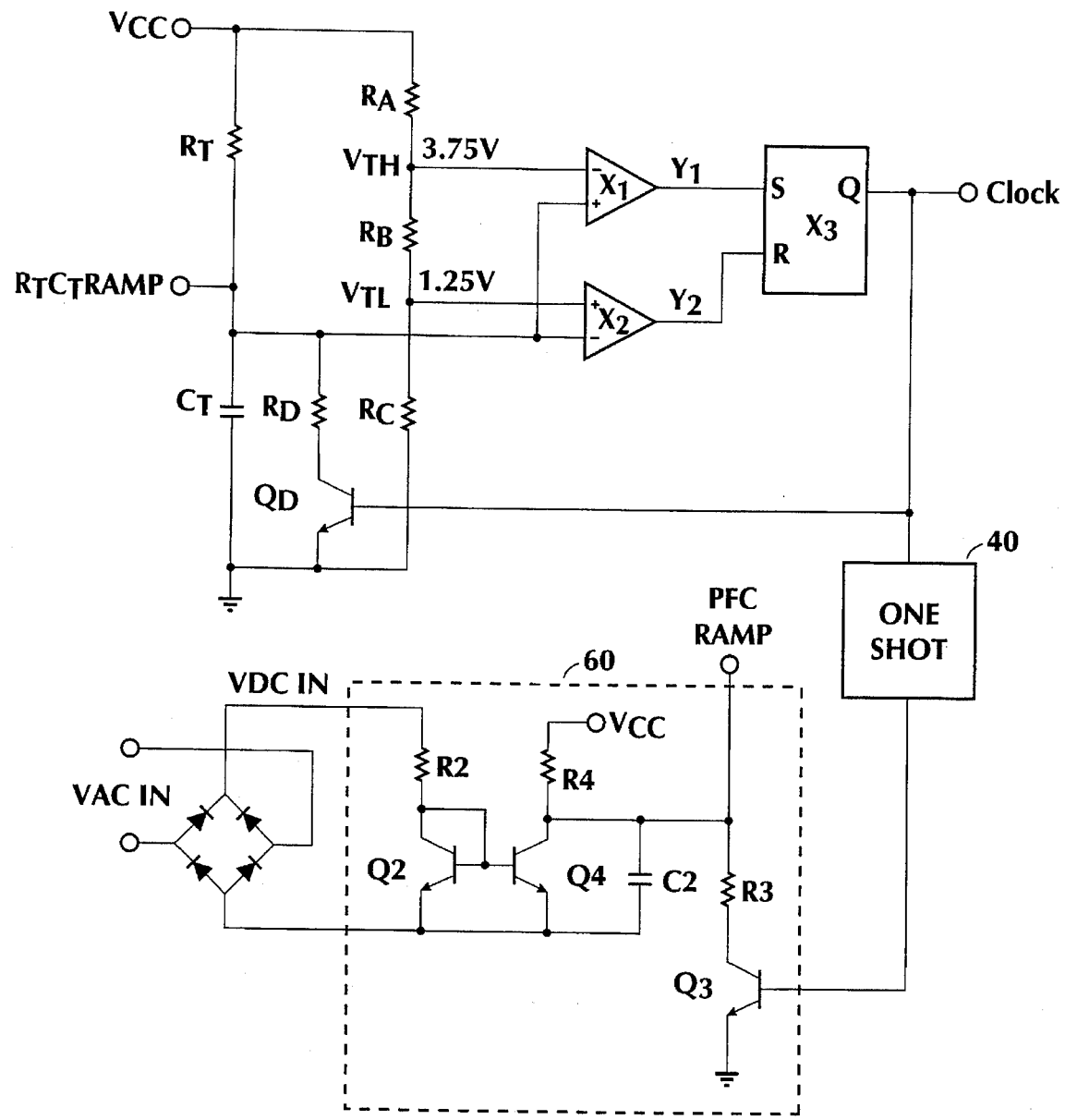
FIG. 11 illustrates a schematic diagram of the preferred embodiment of the oscillator of the present invention.

The preferred embodiment of the oscillator of the present invention is illustrated in FIG. 11. This embodiment of the oscillator of the present invention includes the ramp generating circuit 60. The ramp generating circuit 60 includes a timing resistor R2, a timing capacitor C2, a resistor R4, npn transistors Q2 and Q4, a discharge resistor R3 and a discharge npn transistor Q3. A first terminal of the resistor R2 is coupled to receive the full wave rectified voltage input signal VDCIN. A second terminal of the resistor R2 is coupled to a collector and base of the npn transistor Q2 and to a base of the npn transistor Q4. The emitters of the npn transistors Q2 and Q4 are coupled to ground. A first terminal of the resistor R4 is coupled to the supply voltage VCC. A second terminal of the resistor R4 is coupled to a collector of the npn transistor Q4, to a first terminal of the timing capacitor C2 and to a first terminal of the resistor R3. A second terminal of the resistor R3 is coupled to a collector of the npn transistor Q3. An emitter of the transistor Q3 is coupled to ground. The clock reference signal is coupled to the input of the one-shot circuit 40. The output of the one-shot circuit 40 is coupled to the base of the transistor Q3 for initiating the discharge of the capacitor C2. The PFC ramp reference signal is taken from the node formed by the second terminal of the resistor R4, the first terminal of the capacitor C2 and the first terminal of the resistor R3.

The transistors Q2 and Q4 form a current mirror through which the input current flows and the capacitor C2 is charged. The capacitor C2 is discharged through the discharge resistor R3 and the discharge transistor Q3, during the active portion of the output of the one-shot circuit 40.

Figure 12:
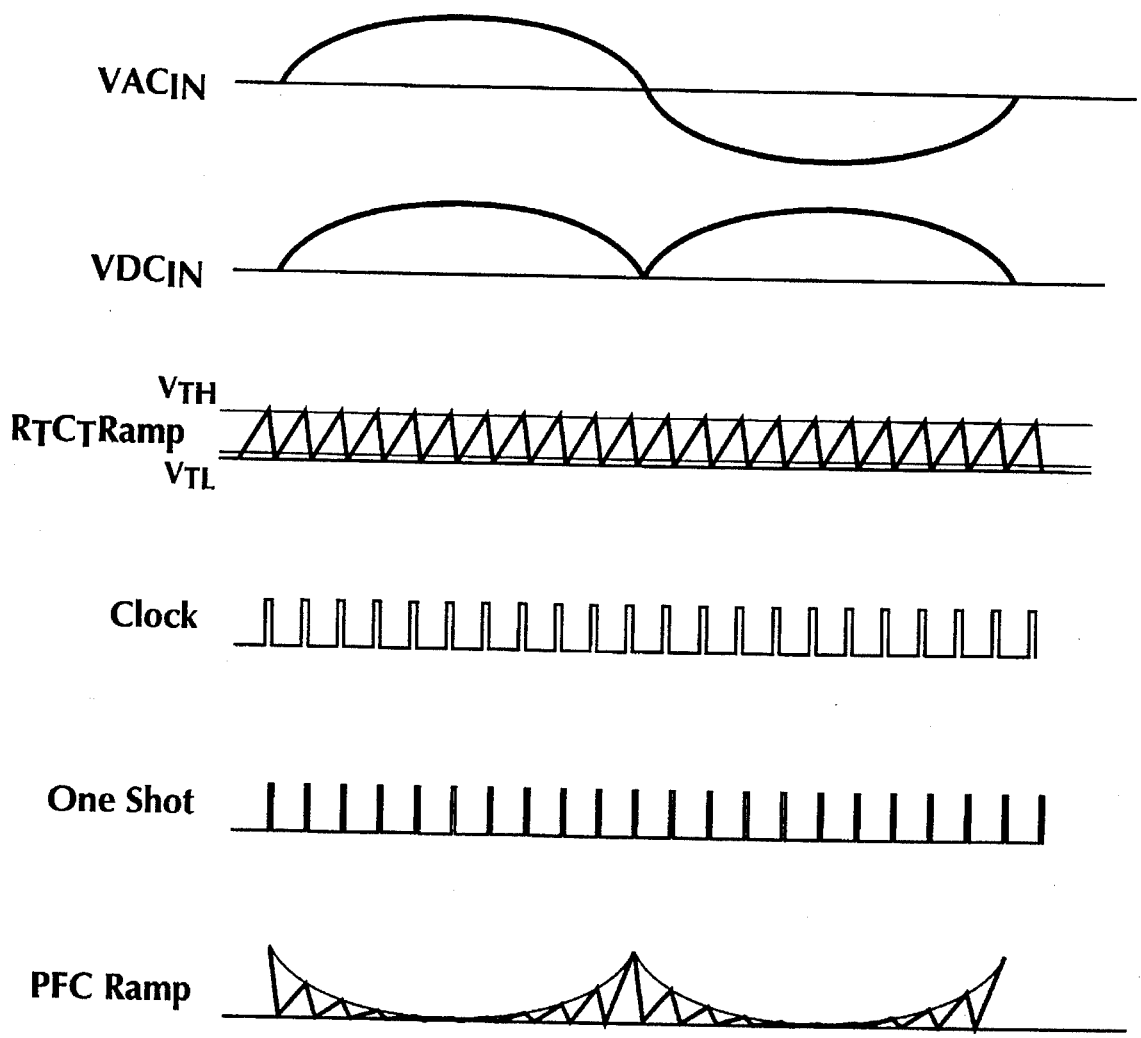
FIG. 12 illustrates a timing diagram of the oscillator of FIG. 11.

Timing diagrams illustrating waveforms from relevant points within the oscillator circuit of FIG. 11 are illustrated in FIG. 12, including the input voltage VACIN, the corresponding full wave rectified input signal VDCIN, the $R_T C_T$ ramp waveform, the corresponding clock signal, the output of the one-shot circuit 40 and the corresponding PFC Ramp waveform. It should be noted that each of the waveforms illustrated in FIG. 12 are identical to the waveforms illustrated in FIG. 10, with the exception of the PFC Ramp waveform. Because of the arrangement of the current mirror, including the transistors Q2 and Q4, the amplitude of the PFC Ramp signal varies in inverse proportion to the full wave rectified input signal VDCIN, as illustrated in FIG. 12. By allowing the amplitude of the PFC Ramp signal to vary in inverse proportion to the full wave rectified input voltage VDCIN, the bandwidth of the current control loop of the power factor correction circuit is kept constant and the transient response is improved. Also, because the amplitude of the PFC Ramp signal varies in inverse proportion to the full wave rectified input voltage VDCIN, by using this PFC Ramp the current multiplier and the RMS voltage input VRMS are not needed. This PFC Ramp signal will serve the gain adjusting function of the RMS voltage input VRMS and the multiplier, as well as ensuring that the input current is in phase with the input voltage. Therefore, a power factor correction circuit using the oscillator of this embodiment will not need the multiplier 30 and the RMS voltage input VRMS, because the modulating comparator 14 will compare the output of the voltage error amplifier 10 to the PFC Ramp signal generated by this oscillator and will thereby also serve the function of the multiplier 30.

A circuit schematic of the one-shot circuit 40 is illustrated in FIG. 13. The one-shot circuit 40 is coupled to receive the clock reference signal output from the flip flop X3 and the $R_T C_T$ ramp signal. The $R_T C_T$ ramp signal is coupled to the negative input of the comparator 80. A voltage reference signal equal to 1.375 volts is coupled to a positive input of the comparator 80. An output of the comparator 80 is coupled as an input to the logical NOR gate 82. The clock signal is coupled as an input to a logical NOR gate 82, to an R input of an R-S latch 84 and as an input to a logical NOR gate 86. An output of the logical NOR gate 82 is coupled to an S input of the R-S latch 84. A Q output of the R-S latch 84 is coupled as an input to the logical NOR gate 86. An output of the logical NOR gate 86 is the output of the one-shot synchronizing circuit 40 and is coupled to control the discharge transistor Q3.

Figure 14:
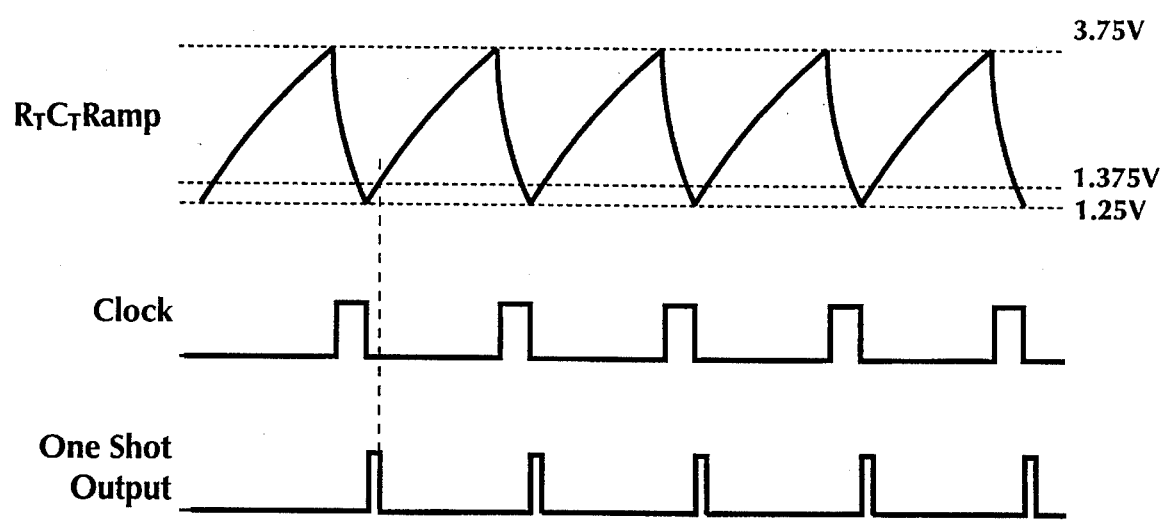
FIG. 14 illustrates a timing diagram of the one-shot circuit of FIG. 13.

Timing diagrams illustrating waveforms from relevant points within the one-shot synchronizing circuit 40 of FIG. 13 are illustrated in FIG. 14, including the $R_T C_T$ ramp signal, the clock signal and the one-shot output signal. The operation of the one-shot circuit 40 will be explained with reference to the timing diagrams of FIG. 14. In the preferred embodiment of the present invention the higher threshold value $V_{TH}$ for the $R_T C_T$ ramp signal is set equal to 3.75 volts and the lower threshold value $V_{TL}$ is set equal to 1.25 volts. The $R_T C_T$ ramp signal will therefore have a peak to peak amplitude of 2.5 volts. The one-shot circuit of the present invention is designed to always have a duty cycle equal to five percent of the period of the clock signal. The one-shot output is raised to a logical high voltage level when the $R_T C_T$ ramp signal is at 1.25 volts and is lowered to a logical low voltage level when the $R_T C_T$ ramp signal is at 1.375 volts or five percent of the amplitude of the $R_T C_T$ ramp signal.

When the $R_T C_T$ ramp signal reaches 3.75 volts the clock output is raised to a logical high voltage level causing the Q output of the R-S latch 84 to rise to a logical low voltage level and the timing capacitor CT to discharge. When the $R_T C_T$ ramp signal discharges to the level below 1.375 volts, the output of the comparator 80 falls to a logical low voltage level. However, because the clock signal is still at a logical high voltage level, the output of the logical NOR gate 82 will not change. When the $R_T C_T$ ramp signal reaches the lower threshold value of 1.25 volts, the clock signal will fall to a logical low voltage level, causing the output of the logical NOR gate 82 to rise to a logical high voltage level. Because the S input of the R-S latch 84 is equal to a logical high voltage level and the R input of the R-S latch 84 is equal to a logical low voltage level, the Q output of the R-S latch 84 will fall to a logical low voltage level. Because both inputs to the logical NOR gate 86 are at a logical low voltage level, the output of the logical NOR gate 86 rises to a logical high voltage level. When the $R_T C_T$ ramp signal then rises to a level greater than 1.375 volts, the output of the comparator 80 will rise to a logical high voltage level causing the output of the logical NOR gate 82 to fall to a logical low voltage level. Because both the S input and the R input of the R-S latch 84 are equal to a logical low voltage level, the Q output will rise to a logical high voltage level causing the output of the logical NOR gate to fall to a logical low voltage level.

The present invention has been described in terms of specific embodiments incorporating details to facilitate the understanding of the principles of construction and operation of the invention. Such reference herein to specific embodiments and details thereof is not intended to limit the scope of the claims appended hereto. It will be apparent to those skilled in the art that modifications may be made in the embodiment chosen for illustration without departing from the spirit and scope of the invention.

I claim:

1. An oscillator for use within a power factor correction circuit, comprising:

a. means for generating a clock output signal having a frequency, a corresponding period, a first output state and a second output state wherein at a beginning of the period the clock output signal is at the first output state and at an end of the period the clock output signal is at the second output state;

b. means for generating a varying amplitude ramp output signal having an increasing state and a decreasing state wherein the means for generating is coupled to receive a full wave rectified alternating current voltage signal from a rectifier; and c. means for synchronizing coupled to the means for generating a clock output signal and to the means for generating a varying amplitude ramp output signal for synchronizing the clock output signal with the varying amplitude ramp output signal so that the varying amplitude ramp output signal is generated with the frequency and the corresponding period.

2. The oscillator as claimed in claim 1 wherein the ramp output signal is coupled for controlling a switch of a power factor correction circuit.

3. The oscillator as claimed in claim 1 wherein the means for synchronizing comprises a one-shot circuit having an input coupled to receive the clock output signal and a synchronizing output coupled to the means for generating a varying amplitude ramp output signal and further wherein the synchronizing output has a duty cycle equal to a predetermined percentage of the period.

4. The oscillator as claimed in claim 3 wherein the means for generating a varying amplitude ramp output signal further includes a first timing resistor and a first timing capacitor coupled to receive the full wave rectified signal and a first discharge transistor coupled to and controlled by the synchronizing output.

5. The oscillator as claimed in claim 4 wherein the means for generating a varying amplitude ramp output signal further comprises a current mirror circuit coupled between the first timing resistor and the first timing capacitor.

6. The oscillator as claimed in claim 4 wherein a peak amplitude of the ramp output signal is equal to an amplitude of the full wave rectified signal from the rectifier circuit.

7. The oscillator as claimed in claim 4 wherein the predetermined percentage is five percent of the period.

8. An oscillator for generating a clock output signal and a varying amplitude ramp output signal for use within a power factor correction circuit, comprising:

a. a clock output signal generating circuit for generating a clock output signal having a frequency, a corresponding period, a first output state and a second output state, wherein the clock output signal is at the first output state at a beginning of the period and at the second output state at an end of the period and wherein the clock output signal generating circuit comprises a second timing resistor, a second timing capacitor and a second discharge transistor and further wherein the clock output signal is coupled for controlling the second discharge transistor;

b. a ramp output signal generating circuit including a first timing resistor, a first timing capacitor and a first discharge transistor, for generating a varying amplitude ramp output signal having an increasing state and a decreasing state; and c. a synchronizing circuit coupled to receive the clock output signal from the clock output signal generating circuit and for controlling the first discharge transistor for synchronizing the clock output signal with the varying amplitude ramp output signal so that the varying amplitude ramp output signal also has the frequency and the corresponding period, and further wherein a synchronizing output has a duty cycle equal to a predetermined percentage of the period.

9. The oscillator circuit as claimed in claim 8 wherein the ramp output signal generating circuit is coupled to receive a full wave rectified signal from a rectifier circuit having an alternating current voltage signal as its input.

10. The oscillator circuit as claimed in claim 9 wherein a peak amplitude of the ramp output signal is equal to an amplitude of the full wave rectified signal from the rectifier circuit.

11. The oscillator circuit as claimed in claim 9 wherein the ramp output signal generating circuit further comprises a current mirror circuit coupled between the first timing resistor and the first timing capacitor.

12. The oscillator circuit as claimed in claim 9 wherein the predetermined percentage is five percent of the period.

13. An oscillator for generating a clock output signal and a varying amplitude ramp output signal for use within a power factor correction circuit, comprising:

a. a first timing resistor having a first terminal and a second terminal, the first terminal of the first timing resistor coupled to a power supply;

b. a first timing capacitor having a first terminal and a second terminal, the first terminal of the first timing capacitor coupled to the second terminal of the first timing resistor forming a timing ramp node and the second terminal of the first timing capacitor coupled to a ground;

c. a voltage divider network including a first resistor, a second resistor and a third resistor each having a first terminal and a second terminal, the first terminal of the first resistor coupled to the power supply, the second terminal of the first resistor coupled to the first terminal of the second resistor forming a high threshold node, the second terminal of the second resistor coupled to the first terminal of the third resistor forming a low threshold voltage node and the second terminal of the third resistor coupled to the ground;

d. a first discharge resistor having a first terminal and a second terminal, the first terminal of the first discharge resistor coupled to the timing ramp node;

e. a first discharge transistor having a base, a collector and an emitter, the collector of the first discharge transistor coupled to the second terminal of the first discharge resistor and the emitter of the first discharge transistor coupled to the ground;

f. a first comparator having a negative input, a positive input and an output, the negative input of the first comparator coupled to the high threshold node and the positive input of the first comparator coupled to the timing ramp node;

g. a second comparator having a negative input, a positive input and an output, the negative input of the second comparator coupled to the timing ramp node and the positive input of the second comparator coupled to the low threshold node;

h. a flip flop having an S input, an R input and a Q output, the S input coupled to the output of the first comparator, the R input coupled to the output of the second comparator and the Q output coupled to the base of the first discharge transistor thereby forming a clock output signal node;

i. a voltage rectifier circuit having an input coupled to receive an alternating current voltage signal and an output producing a full wave rectified signal output;

j. a second timing resistor having a first terminal and a second terminal, the first terminal of the second timing resistor coupled to the full wave rectified signal output;

k. a second timing capacitor having a first terminal and a second terminal, the first terminal of the second timing capacitor coupled to the second terminal of the second timing resistor and the second terminal of the second timing capacitor coupled to the ground;

l. a second discharge resistor having a first terminal and a second terminal, the first terminal of the second discharge resistor coupled to the second terminal of the second timing resistor and to the first terminal of the second timing capacitor thereby forming a varying amplitude ramp signal output node;

m. a second discharge transistor having a base, a collector and an emitter, the collector of the second discharge transistor coupled to the second terminal of the second discharge resistor and the emitter of the second discharge transistor coupled to the ground;

n. a one-shot circuit having an input and an output, the input of the one-shot circuit coupled to the clock output signal node and the output of the one-shot circuit coupled to the base of the second discharge transistor, wherein the one-shot circuit outputs a synchronizing output signal having a duty cycle equal to a predetermined percentage of a period of the clock output signal.

14. The oscillator as claimed in claim 13 further comprising a current mirror circuit coupled between the second terminal of the second timing resistor and the first terminal of the second timing capacitor.

15. A one-shot circuit having an input coupled for receiving a reference signal generated by a first signal generating circuit and an output coupled for controlling a frequency of a generated signal generated by a second signal generating circuit for synchronizing the reference signal and the generated signal, thereby causing the frequency of the generated signal to be equal to a frequency of the reference signal, wherein the output has a duty cycle equal to a predetermined percentage of a corresponding period of the reference signal and wherein the generated signal has an amplitude that is related to an amplitude of a full wave rectified alternating current voltage signal.

16. A synchronizing circuit used within an oscillator of a power factor correction circuit for synchronizing a first output signal, having a first state, a second state, a first frequency and a first corresponding period, generated by a first output signal generating circuit, with a second output signal, having a second frequency, an amplitude related to an amplitude of a full wave rectified alternating current signal, and a second corresponding period, generated by a second output signal generating circuit, so that the first output signal and the second output signal have an equal frequency and corresponding period, wherein the first output signal is a clock signal and the second output signal is a varying ramp output signal, the synchronizing circuit comprising:

a. means for receiving the first output signal; and b. means for transmitting a control output signal having a duty cycle coupled to the means for receiving and to the second output signal generating circuit for controlling the second frequency so that the second frequency is equal to the first frequency, wherein the duty cycle is equal to a predetermined percentage of the first corresponding period.

17. An oscillator, comprising:

a. means for generating a clock output signal having a frequency, a corresponding period, a first output state and a second output state wherein at a beginning of the period the clock output signal is at the first output state and at an end of the period the clock output signal is at the second output state;

b. means for generating a varying amplitude ramp output signal having an increasing state and a decreasing state wherein the ramp output signal is coupled for controlling a switch of a power factor correction circuit; and c. means for synchronizing coupled to the means for generating a clock output signal and to the means for generating a varying amplitude ramp output signal for synchronizing the clock output signal with the varying amplitude ramp output signal so that the varying amplitude ramp output signal is generated with the frequency and the corresponding period.

18. The oscillator as claimed in claim 17 wherein the means for generating a varying amplitude ramp output signal is coupled to receive a full wave rectified signal from a rectifier circuit having as its input an alternating current voltage signal.

19. The oscillator as claimed in claim 18 wherein the means for synchronizing comprises a one-shot circuit having an input coupled to receive the clock output signal and a synchronizing output coupled to the means for generating a varying amplitude ramp output signal and further wherein the synchronizing output has a duty cycle equal to a predetermined percentage of the period.

20. The oscillator as claimed in claim 19 wherein the means for generating a varying amplitude ramp output signal further includes a first timing resistor and a first timing capacitor coupled to receive the full wave rectified signal and a first discharge transistor coupled to and controlled by the synchronizing output.

21. The oscillator as claimed in claim 20 wherein the means for generating a varying amplitude ramp output signal further comprises a current mirror circuit coupled between the first timing resistor and the first timing capacitor.

22. The oscillator as claimed in claim 20 wherein a peak amplitude of the ramp output signal is equal to an amplitude of the full wave rectified signal from the rectifier circuit.

23. The oscillator as claimed in claim 20 wherein the predetermined percentage is five percent of the period.

24. An oscillator for generating a clock output signal and a varying amplitude ramp output signal, comprising:

a. a clock output signal generating circuit for generating a clock output signal having a frequency, a corresponding period, a first output state and a second output state, wherein the clock output signal is at the first output state at a beginning of the period and at the second output state at an end of the period;

b. a ramp output signal generating circuit including a first timing resistor, a first timing capacitor and a first discharge transistor, for generating a varying amplitude ramp output signal having an increasing state and a decreasing state wherein the ramp output signal is coupled for controlling a switch of a power factor correction circuit; and c. a synchronizing circuit coupled to receive the clock output signal from the clock output signal generating circuit and for controlling the first discharge transistor for synchronizing the clock output signal with the varying amplitude ramp output signal so that the varying amplitude ramp output signal also has the frequency and the corresponding period, and further wherein a synchronizing output has a duty cycle equal to a predetermined percentage of the period.

25. The oscillator circuit as claimed in claim 24 wherein the clock output signal generating circuit further comprises a second timing resistor, a second timing capacitor and a second discharge transistor and further wherein the clock output signal is coupled for controlling the second discharge transistor.

26. The oscillator circuit as claimed in claim 25 wherein the ramp output signal generating circuit is coupled to receive a full wave rectified signal from a rectifier circuit having an alternating current voltage signal as its input.

27. The oscillator circuit as claimed in claim 26 wherein a peak amplitude of the ramp output signal is equal to an amplitude of the full wave rectified signal from the rectifier circuit.

28. The oscillator circuit as claimed in claim 27 wherein the ramp output signal generating circuit further comprises a current mirror circuit coupled between the first timing resistor and the first timing capacitor.

29. The oscillator circuit as claimed in claim 26 wherein the predetermined percentage is five percent of the period.

30. A synchronizing circuit for synchronizing a first output signal, having a first state, a second state, a first frequency and a first corresponding period, generated by a first output signal generating circuit, with a second output signal, having a second frequency and a second corresponding period, generated by a second output signal generating circuit, so that the first output signal and the second output signal have an equal frequency and corresponding period, wherein the first output signal is a clock signal and the second output signal is a varying ramp output signal, the synchronizing circuit comprising:

a. means for receiving the first output signal;

b. means for transmitting a control output signal having a duty cycle coupled to the means for receiving and to the second output signal generating circuit for controlling the second frequency so that the second frequency is equal to the first frequency, wherein the duty cycle is equal to a predetermined percentage of the first corresponding period; and c. means for comparing the second output signal to an error signal for forming a switch control signal, wherein the error signal is representative of a difference between a power factor correction circuit output voltage and a desired output voltage and wherein the switch control signal is coupled to control a switch of the power factor correction circuit.

* * * * *

UNITED STATES PATENT AND TRADEMARK OFFICE
CERTIFICATE OF CORRECTION

PATENT NO. : 5,592,128

DATED : Jan. 7, 1997

INVENTOR(S) : Jeffrey H. Hwang

It is certified that error appears in the above-identified patent and that said Letters Patent is hereby corrected as shown below:

In col. 4, line 7, replace "C," with $--C_T--$.

In col. 13, line 9, replace "27" with --26--.

Signed and Sealed this

First Day of April, 1997

Attest:

BRUCE LEHMAN

*Attesting Officer*   Commissioner of Patents and Trademarks